United States Patent
Streubel

(12) 
(10) Patent No.: US 6,607,931 B2
(45) Date of Patent: Aug. 19, 2003

(54) METHOD OF PRODUCING AN OPTICALLY TRANSPARENT SUBSTRATE AND METHOD OF PRODUCING A LIGHT-EMITTING SEMICONDUCTOR CHIP

(75) Inventor: Klaus Streubel, Laaber (DE)

(73) Assignee: Osram Opto Semiconductors GmbH & Co. OHG, Regensburg (DE)

( * ) Notice: Subject to any disclaimer, the term of this patent is extended or adjusted under 35 U.S.C. 154(b) by 0 days.

(21) Appl. No.: 09/793,342

(22) Filed: Feb. 26, 2001

(65) Prior Publication Data

US 2001/0024837 A1 Sep. 27, 2001

(30) Foreign Application Priority Data

Feb. 24, 2000 (DE) .......................................... 100 08 583

(51) Int. Cl.[7] .............................................. H01L 21/20
(52) U.S. Cl. .............................. 438/22; 33/459; 33/977
(58) Field of Search ............................ 438/22–47, 479, 438/481, 483, 455–459, 477

(56) References Cited

U.S. PATENT DOCUMENTS

| 5,008,718 A | 4/1991 | Fletcher et al. |
| 5,376,580 A | 12/1994 | Kish et al. |
| 5,877,070 A | 3/1999 | Goesele et al. |
| 6,448,102 B1 * | 9/2002 | Kneissl et al. |
| 6,468,824 B2 * | 10/2002 | Chen et al. |

OTHER PUBLICATIONS

Hisanori Ishiguro et al.: "High efficient GaAlAs light–emitting diodes of 660 nm with a double heterostructure on a GaAlAs substrate", Appl. Phys. Lett. vol. 43, No. 11, Dec. 1, 1983, pp. 1034–1036.

* cited by examiner

*Primary Examiner*—Savitri Mulpuri
(74) *Attorney, Agent, or Firm*—Laurence A. Greenberg; Werner H. Stemer; Gregory L. Mayback

(57) ABSTRACT

A light-emitting semiconductor chip is produced by applying an epitaxially produced light-emitting semiconductor structure on a transparent substrate. First, a substrate layer is epitaxially grown on a lattice-matched substrate. The substrate layer is bonded, on a side facing away from the lattice-matched substrate, to the transparent substrate through the use of a wafer bonding process. Subsequently, the lattice-matched substrate is removed from the composite formed of the substrate layer and the transparent substrate. The light-emitting semiconductor structure is then epitaxially grown onto the exposed side of the substrate layer. The method is suitable, in particular, for producing light-emitting diode chips with active light-emitting diode structures, for which no optically transparent lattice-matched substrate material is available.

6 Claims, 2 Drawing Sheets

METHOD OF PRODUCING AN OPTICALLY TRANSPARENT SUBSTRATE AND METHOD OF PRODUCING A LIGHT-EMITTING SEMICONDUCTOR CHIP

BACKGROUND OF THE INVENTION

FIELD OF THE INVENTION

The invention relates to a method of producing an optically transparent substrate and to a method of producing a lighte-mitting semiconductor chip with an optically transparent substrate.

Transparent substrates are of great importance, in particular for LED (Light-Emitting Diode) chips, because their light-producing structures generally emit light in all geometrical directions, and consequently also toward the substrate. To achieve the highest luminous efficiency, it is therefore desirable to extract even that portion of the light from the chip that is emitted toward the substrate.

In particular in the case of LED chips with light-producing LED structures based on (AlGa)InP or AlGaAs, this entails the problem that, for these systems of materials, the only lattice-matched substrate which can currently be produced with economically acceptable technical outlay—essentially a GaAs substrate—is optically absorbing at the wavelengths produced by the LED structures in question. The band gap of GaAs is less than the emission energy of the LED structures.

The result of leaving the GaAs substrate in the finished LED chip is consequently that a large proportion (up to 50%) of the radiation emitted by the LED structure is already lost in the chip due to absorption in the substrate.

One possibility of avoiding this problem is disclosed in U.S. Pat. No. 5,376,580. In the method described therein, in order to produce an LED chip with a light-emitting LED structure based on AlGaInP or AlGaAs, an AlGaInP or AlGaAs LED structure, respectively, is first epitaxially grown on a GaAs growth substrate.

The LED structure is subsequently separated from the absorbing GaAs substrate and bonded through the use of wafer bonding to a substrate, e.g. a GaP substrate, which has a high electrical conductivity and is optically transparent for the radiation in question.

The absorbing GaAs substrate is removed before or after the wafer bonding. Removal after the wafer bonding has advantages, in terms of the risk of damage to the LED structure during the removal of the absorbing GaAs substrate or during the wafer bonding, in comparison with removal before the wafer bonding.

In the above-described method, however, the epitaxially grown LED structure, whose electrical and optical properties are known to depend to a considerable extent on the crystal quality of the epitaxial layers, is subjected to additional mechanical (e.g. grinding, polishing etc.) and/or chemical method steps (e.g. etching) when separating the absorbing GaAs substrate, which may damage the epitaxially grown LED structure.

The availability of transparent substrates is very important not only in the case of the system of materials described above but also, for example, in the case of light-emitting semiconductor chips having other systems of materials, such as GaN and InGaN.

SUMMARY OF THE INVENTION

It is accordingly an object of the invention to provide a method of producing an optically transparent substrate which overcomes the above-mentioned disadvantages of the heretofore-known methods of this general type and onto which a semiconductor structure can be epitaxially grown. A further object of the invention is to provide a method of producing a light-emitting semiconductor chip with an optically transparent substrate. With the foregoing and other objects in view there is provided, in accordance with the invention, a method of producing an optically transparent substrate, the method includes the steps of:

providing a lattice-matched substrate;

epitaxially growing a substrate layer on the lattice-matched substrate;

connecting the substrate layer to an optically transparent layer at a side of the substrate layer facing away from the lattice-matched substrate by using a wafer-bonding process; and removing the lattice-matched substrate from a composite formed of the substrate layer and the optically transparent layer.

In other words, the first-mentioned object of the invention is achieved by the following method steps:

a) epitaxial growth of a substrate layer on a lattice-matched substrate, which is optimized in terms of the parameters for the epitaxial growth of the substrate layer and, for example, is optically absorbing and/or electrically insulating, b) application of a prefabricated optically transparent layer onto the side of the substrate layer facing away from the lattice-matched substrate, by using a wafer bonding process, and c) removal of the lattice-matched substrate from the composite formed of the substrate layer and the optically transparent layer.

The method according to the invention has the advantage that the epitaxially grown semiconductor structure can be substantially spared from mechanical and/or chemical stresses.

According to another mode of the invention, the substrate layer is provided as an optically transparent substrate layer.

Using the method according to the invention, it is advantageously possible to produce a substrate in which, on the one hand, the substrate layer allows an epitaxial growth of a semiconductor structure and, on the other hand, the material of the transparent layer is configured principally for an optical transparency which is optimized with respect to the intended use of the substrate.

The lattice constant of the material of the bonded optically transparent layer does not play any role in this regard. Only the substrate layer, which is typically much thinner than the transparent layer and which consequently plays only a subordinate role in terms of transparency and electrical conductivity, is used as a "substrate" for the epitaxial growth e.g. of a light-emitting layer sequence, and must consequently be lattice-matched thereto.

Preferably, the substrate layer is already formed of a material which is optically transparent for the radiation emitted by, for example, a light-emitting semiconductor structure which is provided. Light losses due to absorption in the substrate are thereby advantageously reduced even further.

In order to remove the optically absorbing lattice-matched substrate, it is possible to utilize methods which are known in this context, such as mechanical grinding, lapping, selective wet chemical etching, reactive ion etching or combinations of these methods (cf. e.g. U.S. Pat. No. 5,376,580). A method for the nondestructive removal of the lattice-matched substrate, which permits re-use of the substrate and which may also be utilized in the method according to the invention, is for example described in U.S. Pat. No. 5,877,070.

In terms of suitable methods for bonding the substrate layer to the optically transparent substrate it is likewise possible, for example, to employ the methods of so-called wafer bonding known from the prior art. Various suitable methods are described, e.g. again in U.S. Pat. No. 5,376,580.

The method is suitable, in particular, for the production of light-emitting diode chips with active light-emitting diode structures, for which no optically transparent lattice-matched substrate material is available or for which a lattice-matched transparent substrate cannot be produced with economically acceptable technical outlay.

With the objects of the invention in view there is also provided, a method of producing a light-emitting semiconductor chip structure with an optically transparent substrate, the method includes the steps of:

providing a lattice-matched substrate;

epitaxially growing a substrate layer on the lattice-matched substrate;

connecting the substrate layer to an optically transparent layer at a side of the substrate layer facing away from the lattice-matched substrate by using a wafer-bonding process;

removing the lattice-matched substrate from a composite formed of the substrate layer and the optically transparent layer; and epitaxially growing a light-emitting semiconductor structure onto the substrate layer.

In other words, the second-mentioned object of the invention is achieved by a method in which, a light-emitting semiconductor structure is epitaxially grown onto the substrate layer of a transparent substrate produced in accordance with the method of producing an optically transparent substrate as presented above.

According to another mode of the invention, a light-emitting diode chip with an active light-emitting diode structure based on (AlGa)InP or AlGaAs is produced. A GaAs substrate is used as the lattice-matched substrate. An epitaxially grown (AlGa)InP layer or AlGaAs layer is used as the substrate layer. A GaP substrate is used as the optically transparent layer, and the active light-emitting diode structure is grown onto the substrate layer after the step of removing the lattice-matched substrate.

The method according to the invention is in particular preferably used for the production of light-emitting semiconductor chips with LED structures based on (AlGa)InP or AlGaAs, for which the problem explained above is especially relevant. It may, however, also be used for the production of other radiation-emitting semiconductor chips, in the case of which the substrate properties are important for the functional properties of the chip.

Other features which are considered as characteristic for the invention are set forth in the appended claims.

Although the invention is illustrated and described herein as embodied in a method for producing an optically transparent substrate and a method for producing a light-emitting semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
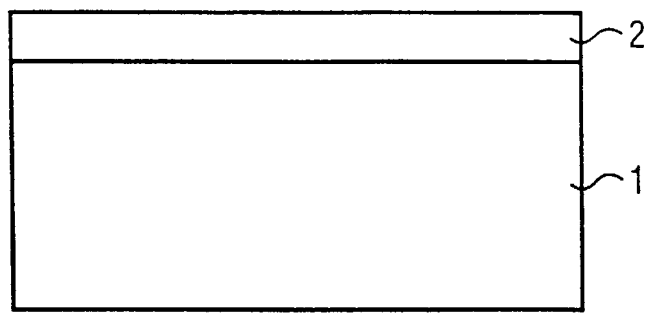
FIGS. 1a to 1c are diagrammatic sectional views of substrate structures for illustrating the method of producing a transparent substrate according to the invention.
Figure 1B:
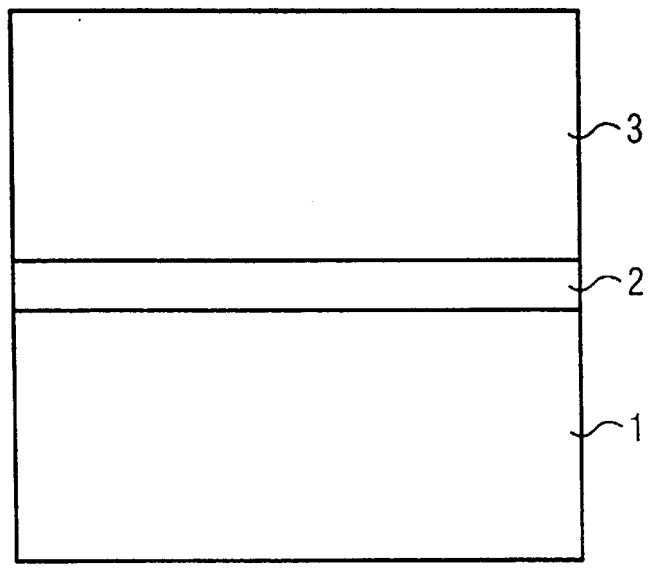
Figure 1C:
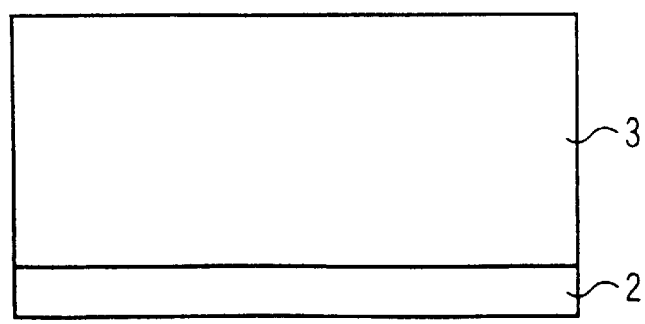

Referring now to the figures of the drawings in detail and first, particularly, to FIGS. 1a to 1c thereof, there is illustrated the method according to the invention. A substrate layer 2 is first epitaxially grown, for example through the use of Metal Organic Vapor Phase Epitaxy (abbreviated to MOVPE), onto a lattice-matched substrate 1 which is formed of GaAs (cf. FIG. 1a).

The substrate layer 2 is formed of n- or p-doped (AlGa)InP, AlGaAs or GaAs.

The substrate layer 2 is subsequently bonded, on the side facing away from the lattice-matched substrate 1, to an electrically conductive and optically transparent wafer 3, by wafer bonding (FIG. 1b). The electrically conductive, optically transparent wafer 3 is formed, for example, of GaP or SiC. These two compounds are suitable, for example, as a transparent substrate material for the light wavelength emitted by an LED structure based on (AlGa)InP or AlGaAs.

In order to produce the wafer composite through the use of wafer bonding, it is possible to employ known wafer bonding methods. One such suitable method is, for example, described at length in U.S. Pat. No. 5,376,580.

After the wafer bonding, the lattice-matched substrate 1 is removed from the composite formed by the substrate layer 2 and the transparent wafer 3 (FIG. 1c). This is done, for example, through the use of mechanical grinding and lapping and/or selective wet chemical etching. Likewise suitable for this is a so-called "smart-cut" process, in which hydrogen implantation and subsequent annealing are used to produce, in the lattice-matched substrate, hydrogen-filled microcracks which lie essentially parallel to the interface between the substrate and the substrate layer and along which the lattice-matched substrate can subsequently be detached from the rest of the wafer composite. The particular advantage of the latter method is that the lattice-matched substrate is not destroyed during the detachment, and is consequently re-usable.

The composite, formed by the transparent wafer 3 and the substrate layer 2, which remains after the removal of the lattice-matched substrate 1 is subsequently used as a substrate for the epitaxial growth of a semiconductor structure, for example an LED structure.

Figure 2A:
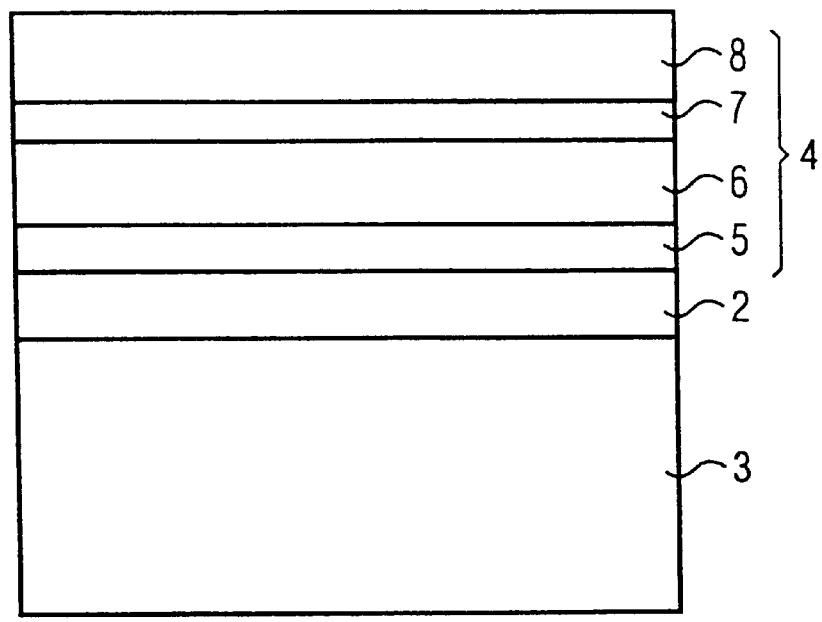
FIGS. 2a and 2b are diagrammatic sectional views of semiconductor structures for illustrating the method of producing LED chips according to the invention.
Figure 2B:
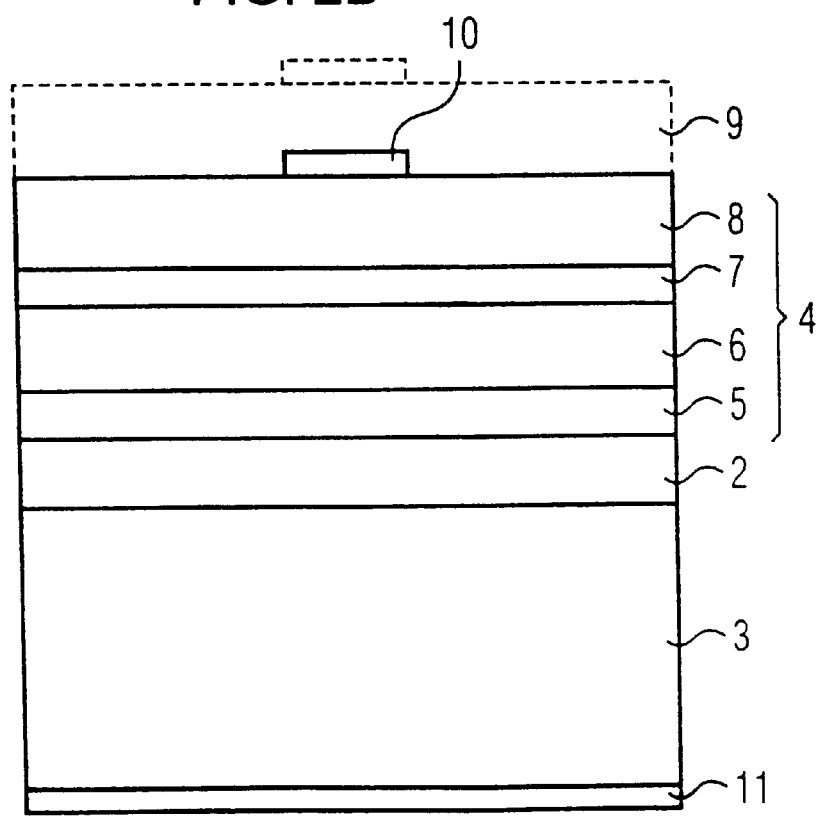

In the method according to FIGS. 2a and 2b, LED chips are produced which, as the epitaxially grown semiconductor structure, have an active LED structure based on (AlGa)InP or AlGaAs.

For this purpose, a buffer layer 5 which is n- or p-doped, respectively, is first grown, for example through the use of MOVPE, onto an n- or p-doped (AlGa)InP or AlGaAs substrate layer 2 of a transparent substrate produced in accordance with the method described in connection with FIGS. 1a to 1c, and a lower barrier layer 6 which is n- or p-doped, respectively, is grown onto this buffer layer 5. Both the buffer layer 5 and the lower barrier layer 6 are formed essentially of (AlGa)InP or AlGaAs, respectively.

If the quality of the substrate layer 2 is sufficient, it is also possible to make do without the buffer layer 5.

An active layer 7, in which the radiative recombinations take place during operation, is epitaxially grown onto the lower barrier layer 6. This active layer again is formed essentially of (AlGa)InP or AlGaAs, respectively.

Finally, an upper barrier layer 8 which is p- or n-doped, respectively, is epitaxially applied onto the active layer 7; this upper barrier layer 8 completes the LED structure 4 and, like the other layers, is essentially formed of (AlGa)InP or AlGaAs, respectively.

Optionally, in order to improve the flux distribution over the entire area of the LED structure and in order to improve further the light extraction from the chip, a window layer 9 (indicated by dashes in FIG. 2b) is applied onto the active LED structure. Such a window layer is, for example, described in U.S. Pat. No. 5,008,718. It is also conceivable, in this regard, to apply an electrically conductive and optically transparent window layer 9 through the use of wafer bonding.

Finally, electrical contacts 10 and 11 are produced, for example in the form of metal layers (FIG. 2b), on the upper barrier layer 8 or optionally on the window layer 9 and on the transparent substrate 3. A gold/zinc alloy, for example, is suitable for the contact 10 on the (AlGa)InP or AlGaAs layer; a gold/germanium alloy, for example, is suitable for the contact 11 at the transparent GaP substrate 3. The contacts 10, 11 can be deposited through the use of a conventional vapor deposition process.

The LED layer sequences described above, including the contact metallizations, are typically processed in the wafer composite, which is subsequently divided into individual LED chips. These LED chips are then, according to the intended use, mounted in various LED packages and processed further to form the desired LED components.

The explanation of the invention with reference to the illustrative embodiments described above is not, of course, to be interpreted as a restriction of the invention to the system of materials employed in this context. On the contrary, the method according to the invention is suitable wherever lattice-matched substrates, which have optimum electrical and/or optical properties for the finished component, are unavailable. Examples include (AlGa)InP-based LEDs on "bonded" SiC substrates and InGaN-based LEDs on "bonded" GaN substrates. It is likewise conceivable for wafers formed of electrically conductive transparent oxides to be bonded as transparent wafers onto the substrate layer.

I claim:

1. A method of producing a light-emitting semiconductor chip structure with an optically transparent substrate, the method which comprises:

providing a lattice-matched substrate;

epitaxially growing a substrate layer on the lattice-matched substrate;

connecting the substrate layer to an optically transparent layer at a side of the substrate layer facing away from the lattice-matched substrate by using a wafer-bonding process;

removing the lattice-matched substrate from a composite formed of the substrate layer and the optically transparent layer; and then epitaxially growing a light-emitting semiconductor structure onto the substrate layer.

2. The method according to claim 1, which comprises providing the substrate layer as an optically transparent substrate layer.

3. The method according to claim 1, which comprises:

producing a light-emitting diode chip with an active light-emitting diode structure based on a material selected from the group consisting of (AlGa)InP and AlGaAs;

using a GaAs substrate as the lattice-matched substrate;

using an epitaxially grown layer selected from the group consisting of an (AlGa)InP layer and a AlGaAs layer as the substrate layer;

using a GaP substrate as the optically transparent layer; and growing the active light-emitting diode structure onto the substrate layer after the step of removing the lattice-matched substrate.

4. The method according to claim 2, which comprises:

producing a light-emitting diode chip with an active light-emitting diode structure based on a material selected from the group consisting of (AlGa)InP and AlGaAs;

using a GaAs substrate as the lattice-matched substrate;

using an epitaxially grown layer selected from the group consisting of an (AlGa) InP layer and a AlGaAs layer as the substrate layer;

using a GaP substrate as the optically transparent layer; and growing the active light-emitting diode structure onto the substrate layer after the step of removing the lattice-matched substrate.

5. The method according to claim 3, which comprises epitaxially applying an electrically conductive optically transparent window layer onto the active light-emitting diode structure.

6. The method according to claim 3, which comprises applying an electrically conductive optically transparent window layer onto the active light-emitting diode structure by using a wafer bonding process.

* * * * *